(12) United States Patent
Alenin et al.

(10) Patent No.: US 7,298,210 B2
(45) Date of Patent: Nov. 20, 2007

(54) FAST SETTLING, LOW NOISE, LOW OFFSET OPERATIONAL AMPLIFIER AND METHOD

(75) Inventors: Sergey V. Alenin, Tucson, AZ (US); Henry Surtihadi, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 41 days.

(21) Appl. No.: 11/136,203

(22) Filed: May 24, 2005

(65) Prior Publication Data

US 2006/0267685 A1 Nov. 30, 2006

(51) Int. Cl.
 *H03F 3/45* (2006.01)
 *H03F 1/02* (2006.01)
 *H03F 3/04* (2006.01)
(52) U.S. Cl. .................. 330/259; 330/9; 330/258; 330/260; 330/261; 330/296; 330/297
(58) Field of Classification Search .............. 330/9, 330/258, 259, 260, 261, 296, 297
See application file for complete search history.

(56) References Cited

U.S. PATENT DOCUMENTS

| | | | | |
|---|---|---|---|---|
| 4,336,502 | A * | 6/1982 | Goto | 330/253 |
| 5,418,494 | A * | 5/1995 | Betti et al. | 330/254 |
| 6,388,522 | B1 * | 5/2002 | Fattaruso et al. | 330/258 |
| 6,661,288 | B2 * | 12/2003 | Morgan et al. | 330/258 |
| 7,019,717 | B2 * | 3/2006 | Yumoto et al. | 345/76 |
| 7,205,833 | B2 * | 4/2007 | Burt et al. | 330/9 |
| 2002/0024384 | A1 * | 2/2002 | Fattaruso et al. | 330/258 |
| 2003/0001674 | A1 * | 1/2003 | Nagaraj | 330/258 |
| 2003/0102849 | A1 * | 6/2003 | Schiff et al. | 323/222 |
| 2005/0127990 | A1 * | 6/2005 | Burt et al. | 330/9 |
| 2005/0140445 | A1 * | 6/2005 | Kim et al. | 330/258 |
| 2006/0267685 | A1 * | 11/2006 | Alenin et al. | 330/258 |

OTHER PUBLICATIONS

Definition of "Operational amplifier" as presented in The New Penguin Dictionary of Science as presented by "xereferplus" 1998.*
"Design of Analog Integrated Circuits And Systems" by Kenneth R. Laker and Willy M. C. Sansen, McGraw-Hill, Inc, 1994, pp. 1-3.

* cited by examiner

*Primary Examiner*—Kenneth Parker
*Assistant Examiner*—Hrayr A. Sayadian
(74) *Attorney, Agent, or Firm*—J. Dennis Moore; W. James Brady, III; Frederick J. Telecky, Jr.

(57) ABSTRACT

An amplifier (10) includes a first stage (4) including differentially coupled first (Q1) and second (Q2) input transistors and a controlled active load circuit (6). A second stage (8) includes differentially coupled third (Q5) and fourth (Q6) input transistors and a load circuit (Q7,8). A first output (2A) of the first stage (4) is coupled to a first input of the second stage (8), a second output (2B) of the first stage (4) being coupled to a second input of the second stage (8). A common mode feedback amplifier (12) has an input coupled to receive a common mode signal (3) from the second stage (8) for producing an amplified common mode signal (9) on a control input of the controlled active load circuit (6) to provide fast settling of an output (Vout) of the second stage without substantially increasing amplifier noise.

6 Claims, 4 Drawing Sheets

FAST SETTLING, LOW NOISE, LOW OFFSET OPERATIONAL AMPLIFIER AND METHOD

BACKGROUND OF THE INVENTION

The present invention relates generally to amplifiers, and more particularly to low noise operational amplifiers having fast settling of the output signal and low input offset voltages.

To achieve low noise in operational amplifiers, it is necessary to minimize the number of circuit elements that contribute noise in the first stage (i.e., the input stage) of the operational amplifier. Typically, the main noise contributors are the two input transistors which constitute the differential input transistor pair of the input stage. In addition to the input transistors, the input stage of a typical low noise operational amplifier also contains load devices, which typically are large-value resistors. However, the resistive load resistors cannot provide sufficiently high voltage gain and often are replaced by active load devices, typically transistors of a current mirror circuit or other symmetrical current source circuitry. In order to minimize noise in the operational amplifier, the transistors used as the active load devices should have much lower transconductance than the transconductance of the input differential transistor pair. In other words, the active load transistors should be heavily degenerated, for example by using long-channel MOS transistors or by using emitter or source degeneration resistors connected in series with the active load transistors. To achieve low input offset voltages in operational amplifiers, it often is necessary to implement both the first (input) stage and the second stage as differential amplifiers and to make the first stage as symmetrical as possible. With symmetrical active load transistors or other symmetrical active load circuitry, the common mode operating point of the first stage of the operational amplifier is usually set by common mode feedback generated by the second stage and applied to a common mode control input of the active load circuitry. An example of a typical implementation of common mode feedback can be found on page 641 a "Design of Analog Integrated Circuits and Systems" by K. R. Laker and W. Sansen. FIG. 1 herein shows a simplified version of such a circuit, a more generalized version of which is shown in FIG. 2.

Referring to prior art FIG. 1, operational amplifier 1 includes an input stage 4 including a P-channel JFET input transistor Q1 having its gate connected to Vin− and its source connected to a tail current source I0 and to the source of a P-channel JFET input transistor Q2 having its gate connected to Vin+. The drain of input transistor Q1 is connected by conductor 2A to the collector of an NPN active load transistor Q3 and to one terminal of a compensation capacitor C2, the other terminal of which is connected to ground. The drain of input transistor Q2 is connected by conductor 2B to the collector of an NPN active load transistor Q4. The bases of active load transistors Q3 and Q4 are connected to a common mode feedback conductor 3. The emitters of active load transistors Q3 and Q4 are coupled to ground by degeneration resistors R0 and R1, respectively.

A second stage 8 of operational amplifier 1 includes emitter-coupled NPN input transistors Q5 and Q6, the emitters of which are connected to common mode feedback conductor 3 and to a tail current source 14. The collector of input transistor Q5 is connected to the collector and base of a diode-connected PNP active load transistor Q7 and to the base of a PNP active load transistor Q8. The emitters of active load transistors Q7 and Q8 are connected to VDD. The collector of input transistor Q6 is connected by output conductor 13 to Vout and to the collector of active load transistor Q8. One terminal of a compensation capacitor C3 is connected to output conductor 13, and its other terminal is connected to the base of input transistor Q6. The bases of transistors Q5 and Q6 are connected to conductors 2A and 2B, respectively.

FIG. 2 is a generalized block diagram of the prior art operational amplifier 1 of FIG. 1, wherein the input stage 4 in FIG. 2 includes input stage differential transistor pair 5 (which can be input transistors Q1 and Q2 of FIG. 1). Input stage differential transistor pair 5 is coupled by conductors 2A and 2B to control the active load circuit 6 and to the inputs of a second stage differential transistor pair 7 (which can be input transistors Q5 and Q6 of FIG. 1). Second stage differential transistor pair 7 is coupled to a current mirror 8 which constitutes an active load circuit. Second stage differential transistor pair 7 produces a common mode feedback signal to control the active load circuit 6 by means of conductor 3.

There is a problem associated with the circuit shown in FIG. 2, in that the combination of common mode feedback between the input stage 4 and the second stage 8 with heavy degeneration of the input stage active load circuitry 6 causes slow settling of Vout in response to an input step signal. In the circuit shown in FIG. 2, the bandwidth of the common mode feedback loop is determined by gm/C2, where gm is the transconductance of the active load circuitry in the input stage and C2 is the value of the Miller compensation capacitor. The transconductance of the active load transistors (or other active load circuitry) in the input stage of the operational amplifier 1 is low when the active loads are heavily degenerated in order to reduce noise and input offset voltage of operational amplifier 1. When the bandwidth of the common mode feedback loop is substantially lower than the bandwidth of the operational amplifier due to large degeneration resistances, the result is slow settling. (The base of transistor Q3 is the input to the common mode feedback loop, and the transconductance of the active load circuit in the common mode feedback loop is limited by the resistances R0 and R1.)

It is known that the operational amplifier circuitry shown in FIGS. 1 and 2 generally has the above-mentioned slow settling behavior. This is illustrated in FIG. 5A, which shows the small signal step response of the circuit shown in FIGS. 1 and 2. In FIG. 5A, curve A represents Vout when degeneration resistances R0 and R1 are small, and curve B represents Vout when R0 and R1 are large. Removing or reducing degeneration resistances R0 and R1 helps to reduce the settling times by increasing the bandwidth of the common mode feedback loop.

A type of input stage known as a "class AB" input stage can provide an output differential current that may be substantially greater than the total DC quiescent output current which a constant tail current source is capable of supplying. This can be accomplished by providing a tail current source circuit which substantially increases the tail current supplied to the differentially-coupled input transistors in response to a higher of the two input voltages which constitute the differential input signal of the class AB input stage. This results in a maximum output current of the class AB input stage which is much larger than could be supplied by a constant tail current source. Since the output current can be very high, class AB input stages typically are used in amplifiers that require very high slew rates. However, class AB input stages have the shortcomings of causing nonlinear circuit operation and generating noise.

There is an unmet need for a low noise operational amplifier having faster settling of the output signal than has been previously achieved.

It also would be desirable to have a low noise operational amplifier in which the bandwidth of the common mode feedback loop can be adjusted independently of the amount of degeneration of the active loads in the input stage of the operational amplifier.

There also is an unmet need for a low noise operational amplifier having faster settling of the output signal and lower input offset voltages than has been previously achieved.

It would be desirable to have an operational amplifier in which the common mode feedback bandwidth can be set close to the gain-bandwidth product of the operational amplifier in order to minimize the slow settling of the output voltage of the above described prior art operational amplifier and nevertheless preserve the stability of the common mode loop.

There also is an unmet need for a low noise, low THD (total harmonic distortion) operational amplifier having faster settling of the output signal than has been previously achieved.

There also is an unmet need for a low noise, low THD (total harmonic distortion) operational amplifier having a class AB input stage.

SUMMARY OF THE INVENTION

It is an object of the invention to provide a low noise operational amplifier having faster settling of the output signal than has been previously achieved.

It is another object of the invention to provide a low noise operational amplifier in which the bandwidth of the common mode feedback loop can be adjusted independently of the amount of degeneration of the active loads in the input stage of the operational amplifier.

It is another object of the invention to provide a low noise operational amplifier having faster settling of the output signal and lower input offset voltages than has been previously achieved.

It is another object of the invention to provide an operational amplifier in which the common mode feedback bandwidth can be set close to the gain-bandwidth product of the operational amplifier in order to minimize the slow settling of the output voltage of the above described prior art operational amplifier and nevertheless preserve the stability of the common mode loop thereof.

It is another object of the invention to provide a low noise, low THD (total harmonic distortion) operational amplifier having faster settling of the output signal than has been previously achieved.

Is another object of the invention to provide a low noise, low THD (total harmonic distortion) operational amplifier having a class AB input stage.

Briefly described, and in accordance with one embodiment, the present invention provides a method of operating an operational amplifier (10) to decrease output settling time of the operational amplifier without substantially increasing operational amplifier noise by providing a first stage (4) including differentially coupled first (Q1) and (Q2) input transistors and a controlled active load circuit (6), coupling a differential output signal produced by the first stage (4) to a differential input of a second stage (8) including differentially coupled third (Q5) and fourth (Q6) input transistors and a load circuit (Q7,8), and amplifying a common mode signal (3) of the second stage (8) to produce an amplified common mode signal (9) on a control input of the controlled active load circuit (6).

In another embodiment, the invention provides an amplifier (10) including a first stage (4) including differentially coupled first (Q1) and second (Q2) input transistors and a controlled active load circuit (6), a second stage (8) including differentially coupled third (Q5) and fourth (Q6) input transistors and a load circuit (Q7,8), a first output (2A) of the first stage (4) being coupled to a first input of the second stage (8), and a second output (2B) of the first stage (4) being coupled to a second input of the second stage (8). A common mode feedback amplifier (12) has an input coupled to receive a common mode signal (3) from the second stage (8) for producing an amplified common mode signal (9) on a control input of the controlled active load circuit (6), so as to provide fast settling of an output (Vout) of the second stage without substantially increasing amplifier noise.

In the described embodiments, the amplifier is an operational amplifier. The controlled active load circuit (6) of the first stage (4) includes first (Q3) and second (Q4) active load transistors each having a control electrode coupled to receive the amplified common mode signal (9). The first (Q1) and second (Q2) input transistors are NPN transistors having emitters coupled to a first tail current source (10) and bases coupled to receive first (Vin−) and second (Vin+) input signals, respectively. The first (Q3) and second (Q4) active load transistors are PNP transistors. A collector of the first (Q1) input transistor is coupled to a collector of the first active load transistor (Q3), a collector of the second (Q2) input transistor is coupled to a collector of the second (Q4) active load transistor, an emitter of the first active load transistor (Q3) is coupled to a first degeneration resistor (R0), and an emitter of the second active load transistor Q4) is coupled to a second degeneration resistor (R1). The third (Q5) and fourth (Q6) input transistors are PNP transistors, and the load circuit (Q7,Q8) of the second stage (8) includes third (Q8) and fourth (Q7) active load transistors both of which are NPN transistors. Emitters of the third (Q5) and fourth (Q6) input transistors are coupled to a second tail current source (R2) and produce the common mode signal (3) on the input of the common mode feedback amplifier (12). A base of the third input transistor (Q5) is coupled to the collector (2A) of the first input transistor (Q1), a base of the fourth input transistor (Q6) is coupled to the collector (2B) of the second input transistor (Q2), a collector of the third input transistor (Q5) is coupled to a base and collector of the third active load transistor (Q8) and a base of the fourth active load transistor (Q7), a collector of the fourth active load transistor (Q7) is coupled to a collector of the fourth input transistor (Q6), and the emitters of the third (Q8) and fourth (Q7) active load transistors are coupled to a first supply voltage (VEE).

The common mode feedback amplifier (12) includes a first input coupled to receive the common mode signal (3) and a second input coupled to a first terminal of a feedback resistor (R5) which has a second terminal coupled to an output of the common mode feedback amplifier (12). A feedback resistor (R5) has a first terminal coupled to the second input of the common mode feedback amplifier (12). A capacitor (C0) has a first terminal coupled to a second terminal of the feedback resistor (R5) and a second terminal coupled to the control input of the controlled active load circuit (6) for the purpose of boosting low frequency gain of the common mode feedback amplifier (12).

In a described embodiment, the common mode feedback amplifier (12) includes first (Q9) and second (Q10) transistors which are PNP transistors, a first resistor (R3) coupled between a second supply voltage (VCC) and an emitter of the first transistor (Q9), a second resistor (R4) coupled between the second supply voltage (VCC) and an emitter of the second transistor (Q10). A collector of the first transistor (Q9) is coupled to a first current source (12) and to bases of the first (Q3) and second (Q4) active load transistors. A collector and a base of the second transistor (Q10) are coupled to a base of the first (Q9) transistor, a second current source (I1), and the emitters of the first (Q3) and second (Q4) active load transistors. In another embodiment, the common mode feedback amplifier (12) includes a first input coupled to receive the common mode signal (3) and a second input coupled to a first terminal of a feedback resistor (R5) having a second terminal coupled to an output of the common mode feedback amplifier (12). A first capacitor (C0) couples the second terminal of the feedback resistor (R5) to the emitter of the first active load transistor (Q3) for the purpose of boosting low frequency gain of the common mode feedback amplifier (12), and a second capacitor (C1) couples the second terminal of the feedback resistor (R5) to the emitter of the second active load transistor (Q4) for the purpose of boosting low frequency gain of the common mode feedback amplifier (12).

In one embodiment, the operational amplifier includes PNP first (Q11) and second (Q13) diode-connected transistors coupled between the second supply voltage (VCC) and the emitters of the first (Q3) and second (Q4) active load transistors, respectively, to function as voltage limiting devices, and also includes a first current mirror output transistor (Q12) having an emitter connected to the second supply voltage (VCC), a base connected to a base and a collector of the first diode-connected transistor (Q11), and a collector connected to the bases of the first (Q3) and second (Q4) active load transistors to improve frequency compensation of a common mode feedback loop of the operational amplifier. The operational amplifier also includes a second current mirror output transistor (Q14) having an emitter connected to the second supply voltage (VCC), a base connected to a base and a collector of the second diode-connected transistor (Q13), and a collector connected to the bases of the first (Q3) and second (Q4) active load transistors to improve frequency compensation of the common mode feedback loop. This embodiment of the invention is especially useful if a class AB input stage is used in the operational amplifier (10A).

DETAILED DESCRIPTION OF THE PREFERRED EMBODIMENTS

Figure 2:
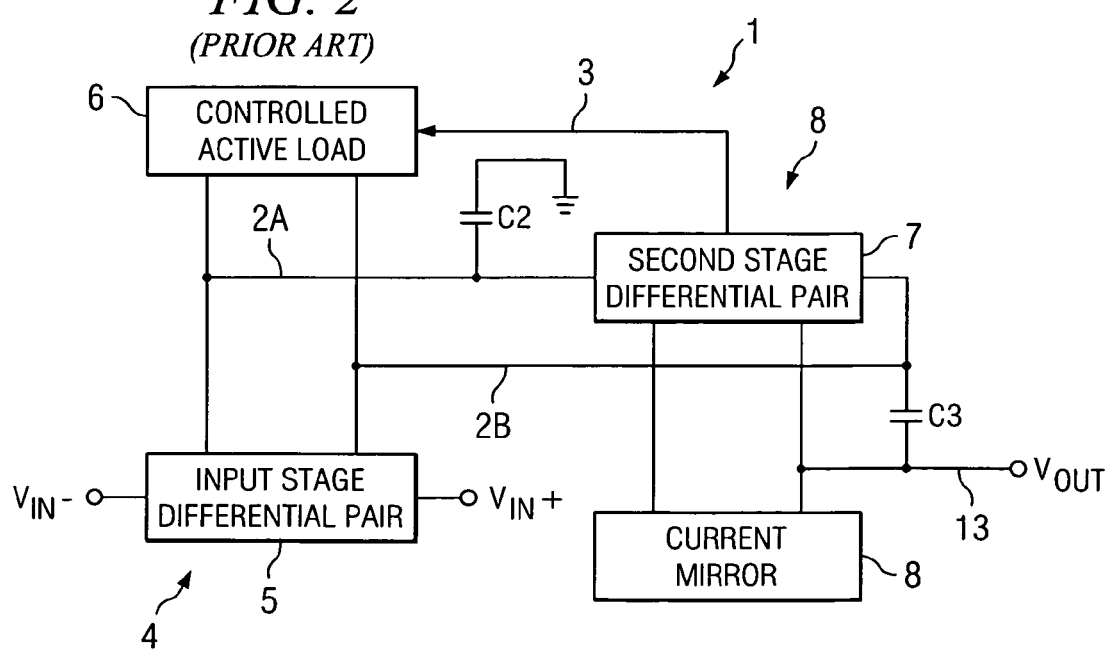
FIG. 2 is a generalized block diagram of the operational amplifier of FIG. 1.
Figure 3:
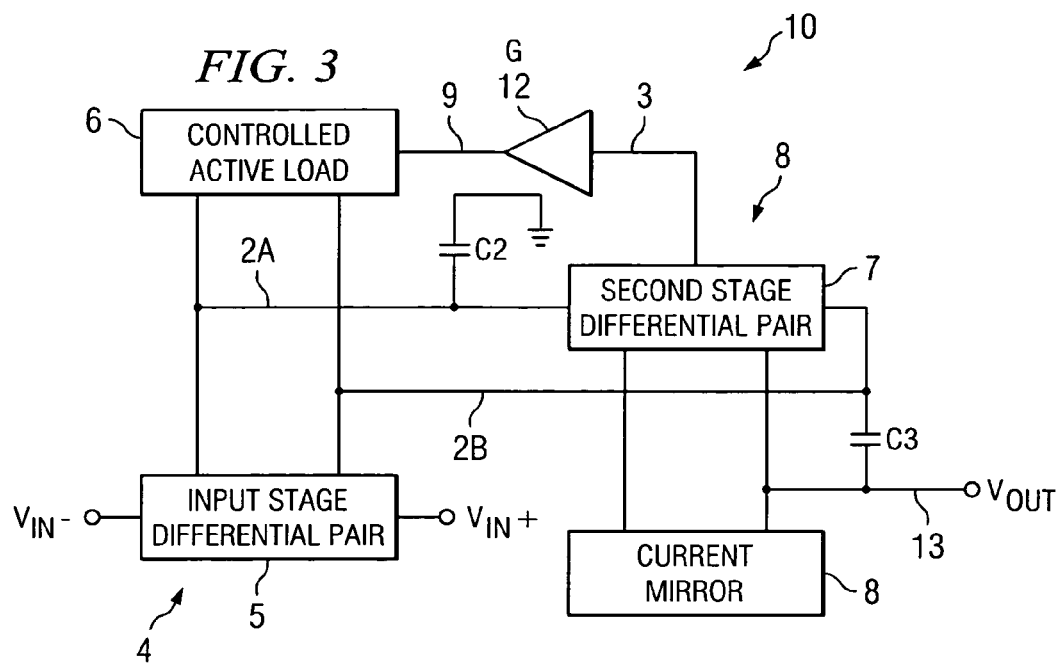
FIG. 3 is a generalized block diagram of an operational amplifier having a common mode voltage gain circuit in the common mode feedback loop to improve output settling time, noise performance, and input offset voltage of the operational amplifier.

FIG. 3 shows a block diagram of a general solution to the above-mentioned slow settling problem of prior art low offset, low noise operational amplifiers. In FIG. 3, the illustrated block diagram of an operational amplifier 10 of the present invention is similar to the block diagram of prior art FIG. 2, except that a common mode feedback gain circuit 12 having a gain G has an input connected to receive the common mode feedback signal produced on conductor 3 by second stage differential pair 7 and produces an amplified common mode feedback signal on conductor 9. Conductor 9 applies the amplified common mode feedback signal to a control input of controlled active load circuit 6. As in prior art FIG. 2, controlled active load circuit 6 is coupled by conductors 2A and 2B to collectors or drains of input transistors of input stage differential transistor pair 5, inputs of which are coupled to Vin− and Vin+. Conductor 2A is connected to one terminal of compensation capacitor C2 and to one input of second stage differential transistor pair 7. Conductor 2B is connected to the other input of second stage differential transistor pair 7 and to one terminal of compensation capacitor C3, the other terminal of which is connected to output conductor 13 on which Vout is produced. Output conductor 13 is connected to a collector or drain of an input transistor of second stage differential pair 7 and to one terminal of current mirror 8. Another terminal of current mirror 8 is connected to a collector or drain of another input transistor in second stage differential pair circuit 7.

Figure 4:
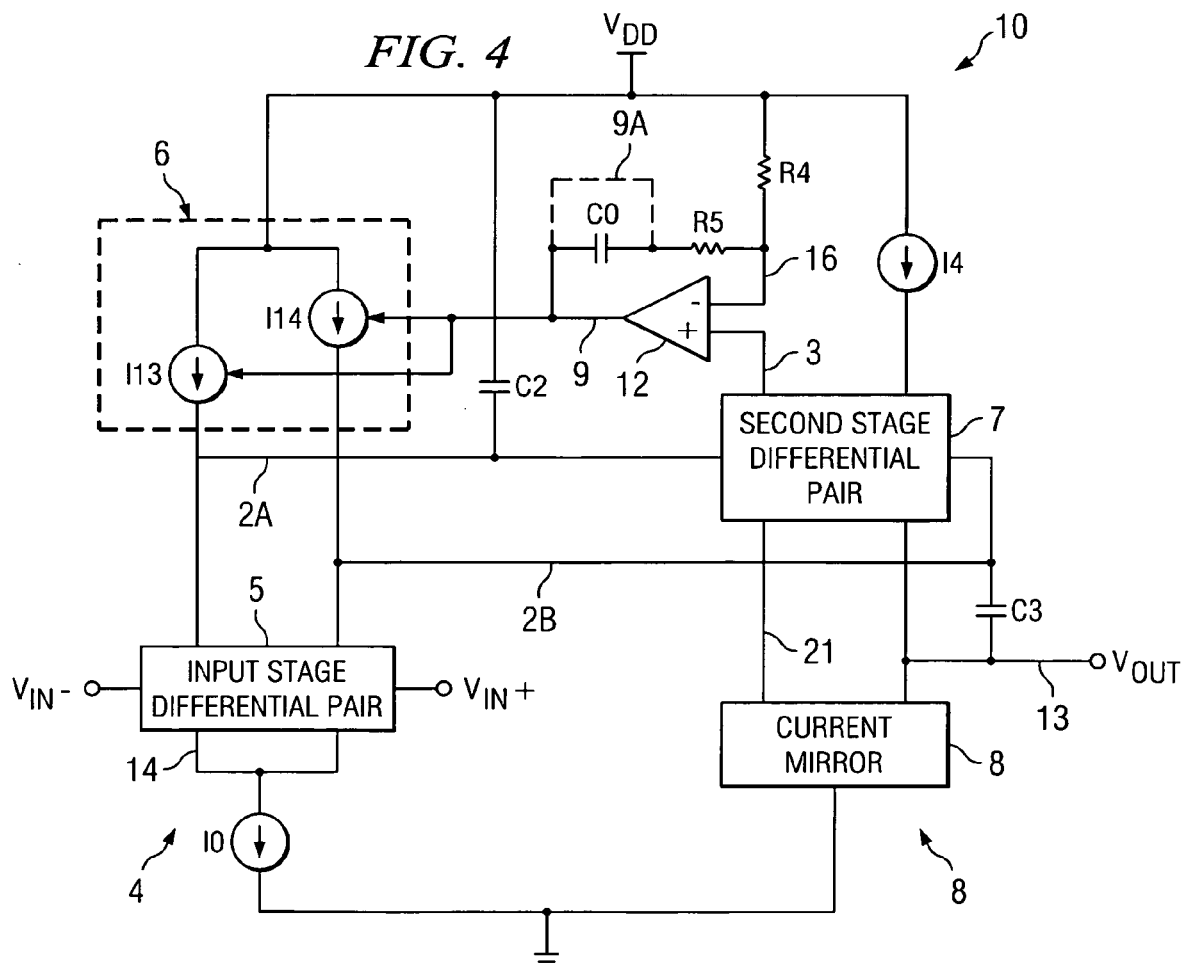
FIG. 4 is a detailed block diagram of the operational amplifier of FIG. 3.

FIG. 4 shows a more detailed block diagram of operational amplifier 10 of FIG. 3. In FIG. 4, conductor 14 is connected to one terminal of a tail current source 10 and to sources or emitters of a pair of input transistors of input stage differential pair 5. A collector or drain of one of the input transistors in input stage 5 is connected by conductor 2A to one terminal of a controlled active load device represented as a controlled current source I13, the other terminal of which is connected to VCC. A collector or drain of another input transistor of input stage differential pair 5 is connected by conductor 2B to one terminal of another controlled active load device represented as controlled current source I14, the other terminal of which is connected to VCC. The control terminals of controlled current sources I13 and I14 are connected to conductor 9 to receive the amplified common mode feedback signal produced by common mode feedback amplifier 12. Conductors 2A and 2B are connected to bases or gates of corresponding input transistors in second stage 7. Second stage differential pair 7 of second stage 8 is connected to a tail current source I4. A common mode feedback signal produced by second stage differential pair 7 is connected by conductor 3 to the (+) input of common mode feedback amplifier 12. The (−) input of common mode feedback amplifier 12 is connected by conductor 16 to one terminal of a resistor R4, the other terminal of which is connected to VCC. Conductor 16 also is connected to one terminal of a feedback resistor R5. Resistors R4 and R5 determine the gain of common mode feedback amplifier 12.

In one implementation, the other terminal of feedback resistor R5 is connected directly to conductor 9 as indicated by dashed line 99A in FIG. 4. In another implementation, dashed line 99A is omitted, and a capacitor C0 is connected between the second terminal of feedback resistor R5 and amplified common mode feedback conductor 9. Collectors or drains of the input transistors in second stage differential pair 7 are connected by means of conductors 21 and 13 to current mirror 8, which is referenced to ground.

With capacitor C0 inserted in the feedback loop as shown in FIG. 4, the bandwidth of the common mode feedback loop continues to be boosted by the high frequency gain of the common mode feedback amplifier (i.e., 1+R5/R4), since capacitor C0 is an AC short-circuit at high frequency. However, at low frequencies capacitor C0 interrupts the DC component of the feedback around amplifier 12 through resistor R4 and feedback resistor R5 and thereby allows the full DC gain of the common mode feedback amplifier 12 to be provided. This also allows the operating points of the second stage and the controlled current sources to be set independently.

At high frequency, capacitor C0 is a short-circuit, so the gain of amplifier 12 is limited according to the expression R5/R4+1, which is equal to the gain of common mode feedback amplifier 12. (Otherwise it would be very difficult to compensate common mode feedback amplifier 12.) The main pole of amplifier 12 is formed by compensation capacitors C2 and C3, which are connected to high impedance circuit nodes and effectively "push" the main pole beyond the gain-bandwidth product frequency of the amplifier, thereby causing it to have good common mode feedback loop signal settling performance.

At low frequency, capacitor C0 blocks feedback through feedback resistor R5, providing the full gain of amplifier 12 within the common mode feedback loop, thereby helping to suppress variation in the common mode voltage on conductor 9B and to reduce nonlinear distortion in amplifier 10A. By increasing gain in the common mode loop at low frequency, capacitor C0 also helps to suppress any common mode voltage swing on conductors 2A and 2B.

As mentioned above, capacitor C0 can be replaced by a short circuit indicated by dashed line 99A in FIG. 4. Both the goal of achieving fast settling performance of amplifier 10 and of the goal of eliminating nonlinear distortion are substantially achieved with capacitor C0 replaced by the short circuit because the pole of common mode feedback amplifier 12 nevertheless is "pushed" to a higher frequency even though the common mode feedback amplifier gain is not boosted at low frequencies without capacitor C0. However, the absence of capacitor C0 would make biasing of the circuitry more complex, and the common mode voltage swing on conductor 9B would be somewhat larger at low frequencies.

Thus, in accordance with the present invention, common mode feedback amplifier 12 is inserted between the first stage active load circuitry 6 and the common mode voltage output of the second stage common-emitter point 3. Common mode feedback amplifier 12 causes the common-mode feedback loop to become faster because the effect of the transconductance of the controlled current sources of the active load circuitry I13 and I14 is gained up by the common mode feedback amplifier 12. The bandwidth of the common mode feedback loop is increased by the gain of the common mode feedback amplifier 12. The gain of amplifier 12 can be set by feedback resistors R5 and R4 as shown in FIG. 4, and is given by the expression Gain=G=1+(R5/R4). This allows the common mode feedback bandwidth to be set close to the gain bandwidth product of the operational amplifier 10 in order to minimize the slow settling effect (i.e., minimize the Vout settling time) of the prior art operational amplifier of FIGS. 1 and 2 and at the same time preserve the stability of the common mode loop.

Figure 5A:
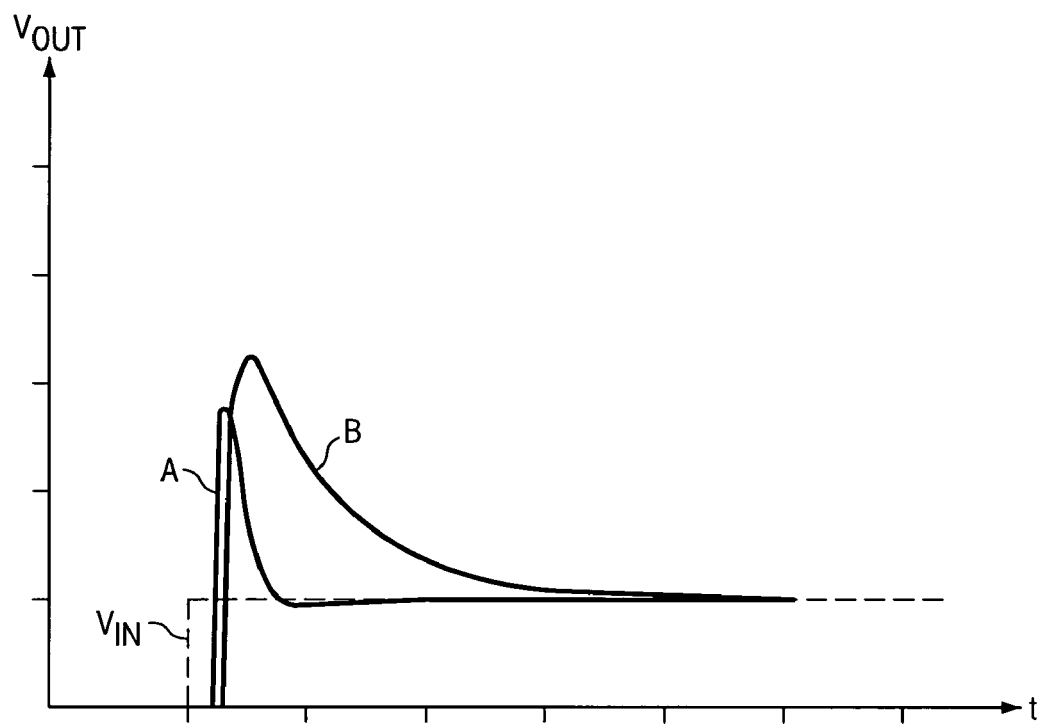
FIG. 5A is a graph illustrating step responses of the operational amplifier circuitry of prior art FIGS. 1 and 2 with low and high degeneration resistances in the active load circuitry of the input stage.
Figure 5B:
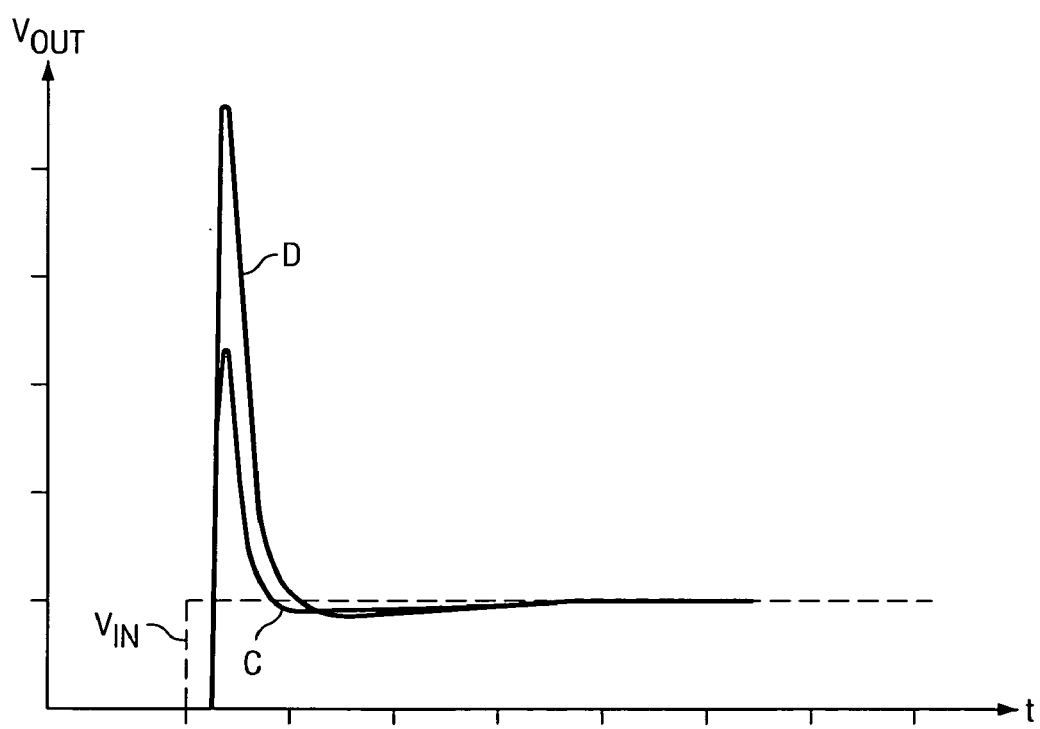
FIG. 5B is a graph illustrating step responses of the operational amplifier circuitry of FIGS. 4 and 6 with low gain and high gain of the common mode voltage amplifier according to the present invention.

FIG. 5B shows faster settling of Vout in a small-signal simulation of operating results for the circuit shown in FIG. 4. Curve C shows the output signal Vout when common mode voltage amplifier 12 has high gain. Curve D shows somewhat slower settling of Vout when common mode voltage amplifier 12 has low gain. Both curves C and D in FIG. 5B show much faster settling of Vout than curve B of FIG. 5A, in which high emitter degeneration is used in the prior art operational amplifier of FIGS. 1 and 2.

Figure 1:
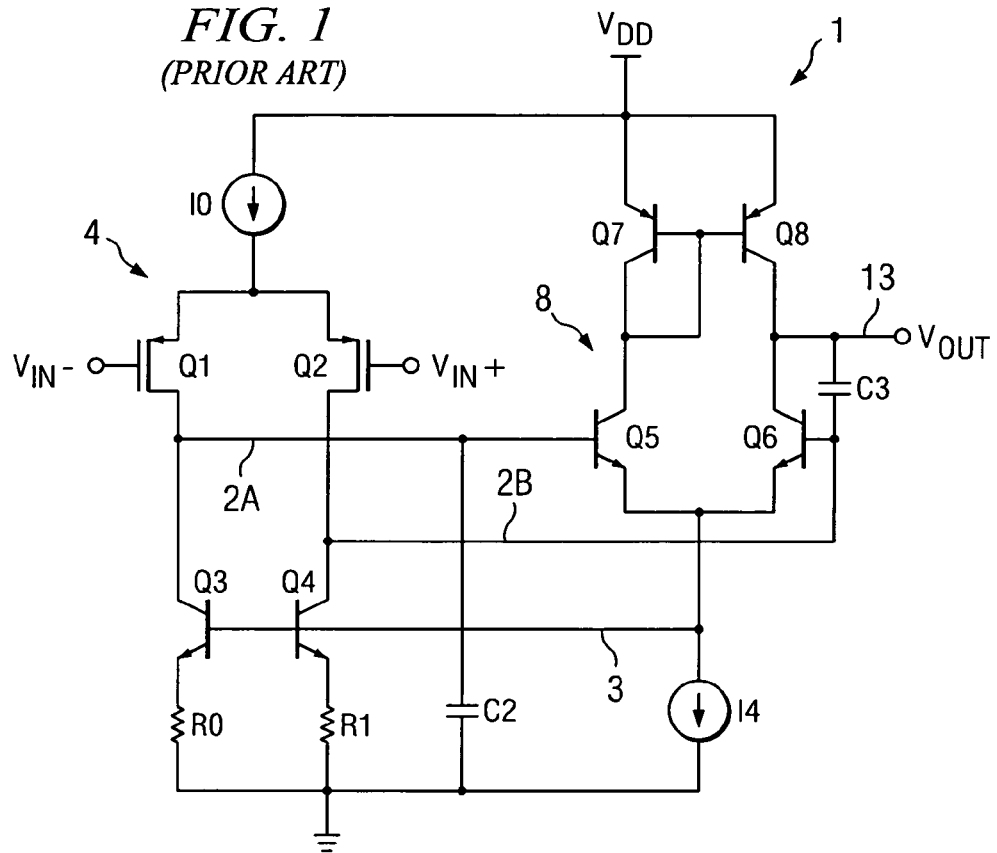
FIG. 1 is a schematic diagram of a prior art operational amplifier.
Figure 6:
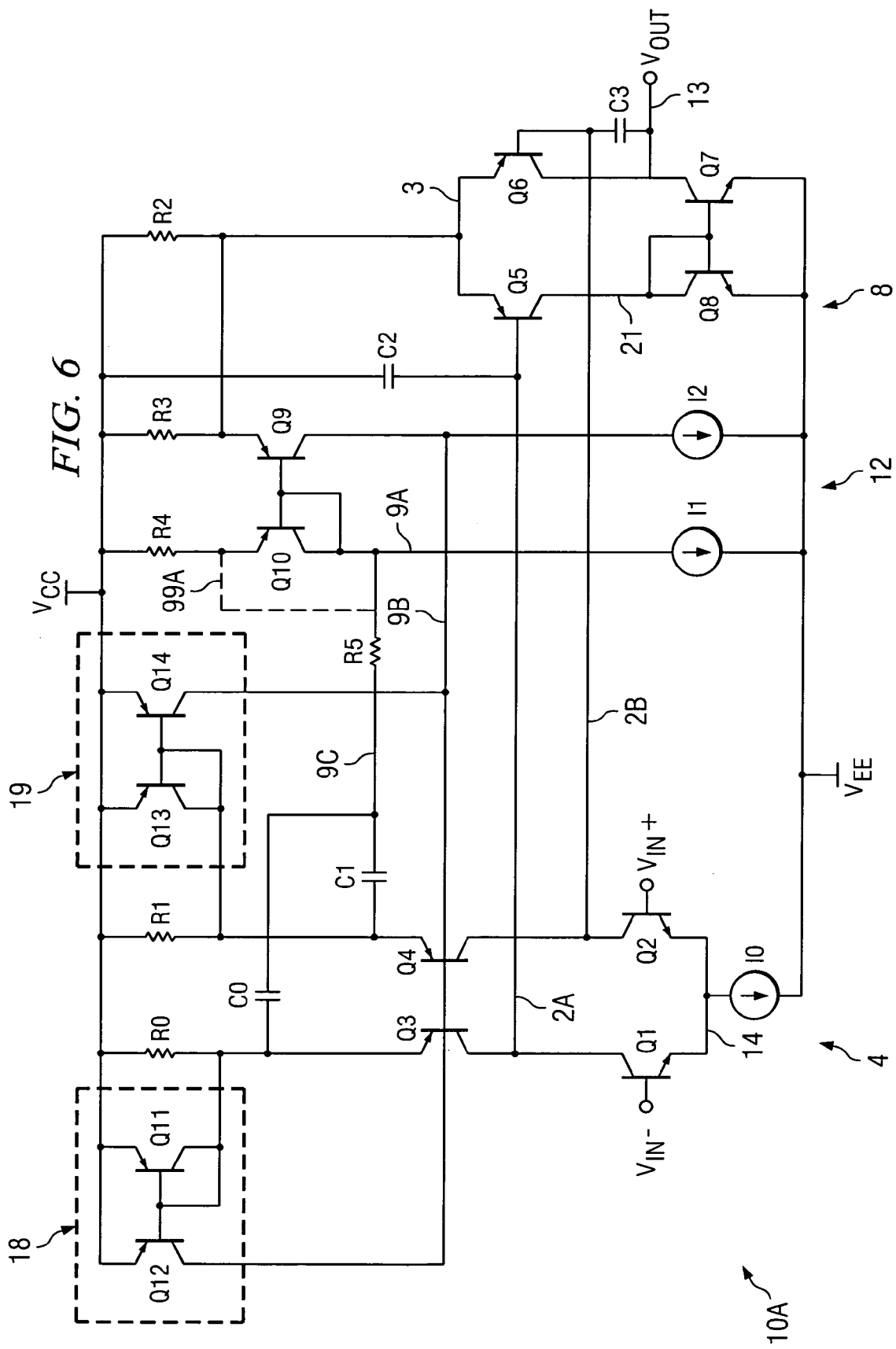
FIG. 6 is a schematic diagram of an implementation of the operational amplifier of FIG. 4.

FIG. 6 shows a more specific implementation of the operational amplifier of FIG. 4 in which two capacitors C0 and C1 are used (instead of only capacitor C0), and the common mode feedback signal applied to common mode feedback amplifier 12 is taken from the emitters of "voltage follower" active load transistors Q3 and Q4. This configuration is much more stable than the general implementation shown in FIG. 4. Where appropriate, the same reference numerals as in FIG. 4 and prior art FIG. 1 are used to designate the same or similar parts.

Referring to FIG. 6, the input stage 4 of operational amplifier 10A includes emitter-coupled NPN input transistors Q1 and Q2 having their bases coupled to Vin− and Vin+, respectively. Their emitters are connected by conductor 14 to one terminal of a tail current source 10, the other terminal of which is connected to VEE. The input stage 4 also includes PNP active load transistors Q3 and Q4 and degeneration resistors R0 and R1. The collector of input transistor Q1 is connected by conductor 2A to the collector of active load transistor Q3, the emitter of which is connected to one terminal of degeneration resistor R0, the other terminal of which is connected to VCC. The collector of input transistor Q2 is connected by conductor 2B to the collector of active load transistor Q4, the emitter of which is connected to one terminal of degeneration resistor R1, the other terminal of which is connected to VCC. The emitters of active load transistors Q3 and Q4 are coupled by capacitors C0 and C1, respectively, and feedback resistor R5 to one output of common mode feedback amplifier 12. The bases of active load transistors Q3 and Q4 are connected by conductor 9B to the other output of common mode feedback amplifier 12, whereby the active load circuit including transistors Q3 and Q4 receives a common mode feedback input signal from common mode voltage amplifier 12.

The second stage 8 of operational amplifier 10A includes PNP input transistors Q5 and Q6 and NPN active load transistors Q7 and Q8. The emitters of input transistors Q5 and Q6 are connected by conductor 3 to one terminal of a tail current resistor R2 to provide a common mode feedback input to common mode voltage amplifier 12. The other terminal of tail current resistor R2 is connected to VCC. The collector of input transistor Q5 is connected by conductor 21 to the collector and base of NPN active load transistor Q8 and to the base of NPN active load transistor Q7, the emitters of which are connected to VEE. The base of input transistor Q5 is connected to an output of input stage 4 by means of conductor 2A. The base of input transistor Q5 also is connected to one terminal of compensation capacitor C2, the other terminal of which is connected to VCC. The base of input transistor Q6 is connected to another output of input stage 4 by means of conductor 2B and also to one terminal of compensation capacitor C3, the other terminal of which is connected to Vout conductor 13.

A first implementation of common mode feedback amplifier 12 includes resistor R3, transistor Q9, and current source I2 connected as an amplifier, with the emitter of transistor Q9 being the non-inverting (+) input, and the base of transistor Q9, which is connected by conductor 9A to feedback resistor R5, being the inverting (−) input. The collector and base of transistor Q10 are connected to the base of transistor Q9. The collector of transistor Q9 is connected to the output 9B of common mode feedback amplifier 12. In this implementation, diode-connected Q10, resistor R4 and current source I1 form a bias circuit for the (−) input, establishing a bias voltage (equal to VCC minus I1 times R4 minus the VBE of transistor Q10) on the base of input transistor Q9.

In a second implementation of common mode feedback amplifier 12, as indicated by dashed line 99A, the right end of feedback resistor R5 can be disconnected from conductor 9A and connected directly to the emitter of transistor Q10, which becomes another input transistor. In this case, the emitter of input transistor Q10 is the (−) input of common mode gain amplifier 12. Performance of the above-mentioned first and second implementations of common mode feedback amplifier 12 is essentially the same.

The emitter of PNP input transistor Q9 is the non-inverting (+) input of common mode feedback amplifier 12, and is connected to common mode feedback conductor 3. The emitter of transistor Q9 also is connected to one terminal of emitter follower resistor R3, the other terminal of which is connected to VCC. In the above-mentioned first implementation, the base of transistor Q9 is the inverting (−) input of common mode feedback amplifier 12. Common mode voltage amplifier 12 also includes diode-connected PNP transistor Q10. The collector of transistor Q9 is connected to conductor 9B and to one terminal of a load device represented by current source I2, the other terminal of which is connected to VEE. The base of transistor Q9 is connected to the base and collector of PNP transistor Q10, the emitter of which is coupled by resistor R4 to VCC. The base and collector of transistor Q10 are connected by conductor 9A to one terminal of feedback resistor R5 and to one terminal of a current source I1 providing bias conditions for common mode gain amplifier 12, the other terminal of which is connected to VEE. The other terminal of feedback resistor R5 is connected by conductor 9C to one terminal of each of capacitors C0 and C1, the other terminal of capacitor C0 being connected to the emitter of active load transistor Q3, and the other terminal of capacitor C1 being connected to the emitter of active load transistor Q4.

In operation, resistors R0 and R1 provide emitter degeneration to active load transistors Q3 and Q4, and tail current source 10 provides biasing to the first stage 4. Current sources I1, I2 and resistors R3 and R4 determine the operating point of the common mode feedback amplifier 12, and the tail current of the second stage 8 is determined by resistor R2 or other suitable current source. Capacitors C2 and C3 provide frequency compensation of the main operational amplifier 10A. The ratio of resistances R5 and R4 determines the gain of common mode feedback amplifier 12. Capacitors C0 and C1 are an equivalent implementation of the single capacitor C0 in FIG. 4. With capacitors C0 and C1 inserted in the feedback loop as shown in FIG. 6, the bandwidth of the common mode feedback loop continues to be boosted by the high frequency gain of the common mode feedback amplifier (i.e., 1+R5/R4), but the DC gain of the common mode feedback amplifier 12 is much higher as capacitors C0 and C1 are DC open circuits at low frequency. This allows the operating points of the second stage and the controlled current sources to be set independently. Resistors R4 and R5 together with capacitors C0 and C1 determine the amount of frequency compensation of the common mode feedback loop. The emitter voltages of controlled active load transistors Q3 and Q4 track the common mode feedback control voltage on conductor 9B at their bases, while providing low output impedance of amplifier 12 and higher common mode feedback loop gain. Note that with respect to operation of the common mode feedback loop, active load transistors Q3 and Q4 act like voltage followers.

It should be appreciated, however, that there are many ways to close the gain settling feedback loop around the common mode feedback amplifier in a practical implementation of operational amplifier 10A.

The left terminal of feedback resistor R5 should not be directly connected to the high impedance of conductor 9B because that would limit the gain of the amplifier circuitry Q9,R3,I2. Instead, the left terminal of feedback resistor Q5 can be coupled by means of capacitors C0 and C1 to the low emitter impedances of transistors Q3 and Q4, which function as voltage follower buffer stages. This prevents the gain of common mode feedback amplifier 12 from being degraded due to loading of its output (i.e., conductor 9B) by feedback resistor R5.

In one embodiment of operational amplifier 10A, an optional current mirror 18 includes diode-connected PNP voltage limiting transistor Q11 having its base and collector connected to the emitter of input transistor Q3. This embodiment is beneficial if large voltage drops occur across degeneration resistors R0 and R1, which is the case if a conventional class AB input stage is used instead of the ordinary input stage shown in FIG. 6. The base and collector of voltage limiting transistor Q11 are connected to the base of PNP current mirror output transistor Q12, the collector of which is connected to common mode feedback conductor 9B. The emitters of transistors Q11 and Q12 are connected to VCC. Similarly, an optional current mirror 19 includes diode-connected PNP voltage limiting transistor Q13 having its base and collector connected to the emitter of input transistor Q4. The base and collector of voltage limiting transistor Q13 are connected to the base of PNP current mirror output transistor 14, the collector of which is connected to common mode feedback conductor 9B. The emitters of transistors Q13 and Q14 are connected to VCC.

If a class AB input stage is used without diode-connected transistors Q11 and Q13, the large voltage swings across the degeneration resistors R0 and R1 resulting from large peak output currents of the class AB input stage can degrade signal linearity in the second stage and limit its dynamic range. A class AB input stage would cause peak currents through degeneration resistors R0 or R1 to be much greater (i.e., 10 to 100 times greater) than the peak amount of current through each input transistor of the input stage. (Class AB input stages are conventionally used for a class of amplifiers that need to have very high slew rates.) If a class AB input stage is used without diode-connected transistors Q11 and Q12, the voltage on conductor 9B will be a substantially distorted signal within the common mode feedback loop if there is a large difference between input signals Vin+ and Vin−. The voltages on conductors 2A and 2B will track the nonlinear, i.e., distorted, signal on conductor 9B and will apply distorted voltage signals to the bases of input transistors Q5 and Q6. This will cost distortion in the output signal Vout.

However, with common mode feedback amplifier 12 connected as described above, the voltage on conductor 9B is well controlled. Common mode feedback amplifier 12 suppresses and substantially reduces the common mode voltage swing and the nonlinear signal component applied to the input of the second stage 8 by means of conductors 2A and 2B. This results a substantial reduction of THD in the amplifier output signal Vout.

To solve this problem, diode-connected transistors Q11 and Q13 are provided as voltage limiters connected across degeneration resistors R0 and R1, respectively, to prevent transistors Q3 and Q4 from saturating. Also, transistors Q12 and Q14 together with transistors Q11 and Q13 are connected to form current mirrors 18 and 19, as shown in FIG. 6, which in effect contribute to the necessary frequency compensation for the common mode feedback loop whenever diode-connected transistors Q11 and Q13 are turned on by a large transient current flowing into transistors Q3 and Q4 from a class AB input stage that is being used.

Most of the time there is no current through transistors Q12 or Q14 because diode-connected transistors Q11 and Q13 are off because there is not enough current through to produce a sufficiently large voltage drop across degeneration resistors R0 and R1 to turn diode-connected transistors Q11 and Q13 on. However, when amplifier 10A includes a class AB input stage and goes into a slewing mode, this causes peak transient currents through degeneration resistors R0 sufficiently large to turn on diode-connected transistors Q11 and Q13. Without the benefit of current mirror output transistors Q12 and Q13, the common mode loop would become unstable and difficult to compensate. However, the use of current mirrors 18 and 19 converts the active load circuitry including transistors Q3 and Q4 into a kind of current amplifier with low gain, which is more easily compensated. When transistors Q11 and Q13 are on, transistors Q3 and Q4 are only weakly degenerated, and the degeneration factor approaches one-half as transistors Q11 and Q13 become fully turned on. (The degeneration factor is the ratio of gm that is set using degeneration resistors to the gm of the transistor itself (without degeneration resistors). In general, for a bipolar transistor implementation, the degeneration factor can be considered to be given by the expression $(V_{DEGEN}/V_T)+1$, where $V_{DEGEN}$ is the voltage drop across the degeneration and $V_T$ is equal to kT/q (which is 26 millivolts for silicon).

Thus, during a transient common mode feedback voltage on conductor 9B, the combination of the transconductance of transistors Q3 and Q4 (which suddenly becomes high) and the transconductance of common mode feedback amplifier 12 cause the common mode feedback loop have very wide bandwidth. Additional frequency compensation therefor is needed, and is provided by PNP current mirror output transistors Q12 and Q14, which allow the active load circuitry including transistors Q3 and Q4 to also function as part of a Wilson current mirror with limited current gain when transistors Q11 and Q13 are turned on, without diminishing their function as an active load circuit for input transistors Q1 and Q2. That is, when transistors Q3, Q11 and Q12 and Q4, Q13 and Q14 all turn on, they form Wilson current mirrors in the common mode feedback loop, with a common mode feedback loop input current through conductor 9B being applied as an input to the bases of transistors Q3 and Q4. The gain of the Wilson current mirrors is the ratio of the emitter areas of transistors Q12 and Q11 and the emitter areas of transistors Q14 and Q13. The bandwidth of the common mode feedback loop therefore is determined by common mode feedback amplifier transconductance associated with transistor Q9 amplified by the current mirror gain (i.e., the emitter area of transistor Q11 divided by the emitter area of transistor Q12) and the capacitance of capacitors C2 and C3.

The present invention thus allows adjustment of the common mode loop bandwidth to produce faster settling of operational amplifier 10A without reducing the amount of degeneration in the active load transistors Q3 and Q4 by means of first gain stage current mirrors 18 and 19, and at the same time keeping the input stage 4 balanced using common mode feedback.

Unlike the prior art, the bandwidth of the common mode feedback loop can be adjusted independently of the amount of degeneration of the active loads. The result is faster settling of Vout compared to that in typical prior art operational amplifiers, as shown in FIGS. 5A and 5B.

Also, the present invention provides improved THD of the described operational amplifiers for the reasons explained above.

Although complementary bipolar transistor implementations have been illustrated, the invention is similarly applicable to CMOS implementations.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, although the described embodiments are operational amplifiers, the invention is generally applicable to other kinds of differential amplifiers.

What is claimed is:

1. An operational amplifier comprising:
   (a) a first stage including differential-pair-coupled first and second input transistors and a controlled active load circuit;
   (b) a second stage including differential-pair-coupled third and fourth input transistors and a load circuit, a first output of the first stage being coupled to a first input of the second stage, a second output of the first stage being coupled to a second input of the second stage; and
   (c) a common mode feedback amplifier having a first input coupled to receive a common mode signal from the second stage for producing an amplified common mode signal on a control input of the controlled active load circuit, so as to provide fast settling of an output of the second stage without substantially increasing amplifier noise, wherein the controlled active load circuit of the first stage includes first and second active load transistors each having a control electrode coupled to receive the amplified common mode signal, and wherein the first stage includes a first current mirror including a first diode-connected transistor having a control electrode coupled to a first electrode of the first active load transistor and to a control electrode of a first current mirror output transistor, a second electrode of the first current mirror output transistor being coupled to the control electrodes of the first and second active load transistors, and wherein the first stage also includes a second current mirror including a second diode-connected transistor having a control electrode coupled to a first electrode of the second active load transistor and to a control electrode of a second current mirror output transistor, a second electrode of the second current mirror output transistor being coupled to the control electrodes of the first and second active load transistors, to contribute to compensation of a common mode feedback loop of the amplifier.

2. An operational amplifier comprising:
   (a) a first stage including differential-pair-coupled first and second input transistors and a controlled active load circuit;
   (b) a second stage including differential-pair-coupled third and fourth input transistors and a load circuit, a first output of the first stage being coupled to a first input of the second stage, a second output of the first stage being coupled to a second input of the second stage; and
   (c) a common mode feedback amplifier having a first input coupled to receive a common mode signal from the second stage for producing an amplified common mode signal on a control input of the controlled active load circuit, so as to provide fast settling of an output of the second stage without substantially increasing amplifier noise, wherein the controlled active load circuit of the first stage includes first and second active load transistors each having a control electrode coupled to receive the amplified common mode signal, wherein the first and second input transistors are NPN transistors having emitters coupled to a first tail current source and bases coupled to receive first and second input signals, respectively, and wherein the first and second active load transistors are PNP transistors, a collector of the first input transistor being coupled to a collector of the first active load transistor, a collector of the second input transistor being coupled to a collector of the second active load transistor, an emitter of the first active load transistor being coupled to a first degeneration resistor and an emitter of the second active load transistor being coupled to a second degeneration resistor, and wherein the third and fourth input transistors are PNP transistors, and wherein the load circuit of the second stage includes third and fourth active load transistors both of which are NPN transistors, emitters of the third and fourth input transistors being coupled to a second tail current source and producing the common mode signal on the input of the common mode feedback amplifier, a base of the third input transistor being coupled to the collector of the first input transistor, a base of the fourth input transistor being coupled to the collector of the second input transistor, a collector of the third input transistor being coupled to a base and collector of the third active load transistor and a base of the fourth active load transistor, a collector of the fourth active load transistor being coupled to a collector of the fourth input transistor, emitters of the third and fourth active load transistors being coupled to a first supply voltage.

3. The amplifier of claim 2 wherein the common mode feedback amplifier includes a second input coupled to a first terminal of a feedback resistor for limiting the high frequency gain of the common mode feedback amplifier, the feedback resistor having a second terminal coupled to an output of the common mode feedback amplifier, a first capacitor coupling the second terminal of the feedback resistor to the emitter of the first active load transistor for boosting low frequency gain of the common mode feedback amplifier, and a second capacitor coupling the second terminal of the feedback resistor to the emitter of the second active load transistor boosting the low frequency gain of the common mode feedback amplifier.

4. The amplifier of claim 2 including PNP first and second diode-connected transistors coupled between the second supply voltage and the emitters of the first and second active load transistors, respectively, to function as voltage limiting devices, and also including a first current mirror output transistor having an emitter connected to the second supply voltage, a base connected to a base and a collector of the first diode-connected transistor, and a collector connected to the bases of the first and second active load transistors to improve frequency compensation of a common mode feedback loop of the operational amplifier, the operational amplifier also including a second current mirror output transistor having an emitter connected to the second supply voltage, a base connected to a base and a collector of the second diode-connected transistor, and a collector connected to the bases of the first and second active load transistors to improve frequency compensation of the common mode feedback loop.

5. An operational amplifier comprising:
   (a) a first stage including differential-pair-coupled first and second input transistors and a controlled active load circuit;
   (b) a second stage including differential-pair-coupled third and fourth input transistors and a load circuit, a first output of the first stage being coupled to a first input of the second stage, a second output of the first stage being coupled to a second input of the second stage; and
   (c) a common mode feedback amplifier having a first input coupled to receive a common mode signal from the second stage for producing an amplified common mode signal on a control input of the controlled active load circuit, so as to provide fast settling of an output of the second stage without substantially increasing amplifier noise, wherein the controlled active load circuit of the first stage includes first and second active load transistors each having a control electrode coupled to receive the amplified common mode signal, and wherein the common mode feedback amplifier includes first and second transistors which are PNP transistors, a first resistor being coupled between a second supply voltage and an emitter of the first transistor, a second resistor being coupled between the second supply voltage and an emitter of the second transistor, a collector of the first transistor being coupled to a first current source and to bases of the first and second active load transistors, a collector and a base of the second transistor being coupled to a base of the first transistor, a second current source, and the emitters of the first and second active load transistors.

6. A method of operating an operational amplifier to decrease output settling time of the operational amplifier without substantially increasing operational amplifier noise, the method comprising:
   (a) providing a first stage including differential-pair-coupled first and second input transistors and a controlled active load circuit;
   (b) coupling a differential output signal produced by the first stage to a differential input of a second stage including differential-pair-coupled third and fourth input transistors and a load circuit; and
   (c) amplifying a common mode signal of the second stage to produce an amplified common mode signal on a control input of the controlled active load circuit, and
   (d) operating a first current mirror including a first diode-connected transistor and a first current mirror output transistor to reduce variation in the amplified common mode signal by limiting a voltage drop across a first degeneration resistor coupled to a first electrode of a first active load transistor in the controlled active load circuit by turning on the first diode-connected transistor in response to an overvoltage across the first degeneration resistor, the first active load transistor having a control electrode coupled to the control input of the controlled active load circuit, the method including producing a mirrored current in the first current mirror output transistor in response to a current in the first diode-connected transistor resulting from the overvoltage and conducting the mirrored current into a conductor coupled to the control input of the controlled active load circuit.

* * * * *